(12) United States Patent
Sakata et al.

(10) Patent No.: US 9,991,671 B2
(45) Date of Patent: Jun. 5, 2018

(54) METHOD FOR PRODUCING SEMICONDUCTOR LASER ELEMENT

(71) Applicant: NICHIA CORPORATION, Anan-shi, Tokushima (JP)

(72) Inventors: Hiroki Sakata, Tokushima (JP); Hiroki Koizumi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days. days.

(21) Appl. No.: 15/258,868

(22) Filed: Sep. 7, 2016

(65) Prior Publication Data

US 2017/0077672 A1    Mar. 16, 2017

(30) Foreign Application Priority Data

Sep. 11, 2015  (JP) ................. 2015-179967

(51) Int. Cl.
| | |
|---|---|
| H01L 21/00 | (2006.01) |
| H01L 21/33 | (2006.01) |
| H01L 21/82 | (2006.01) |
| H01S 5/02 | (2006.01) |
| H01S 5/042 | (2006.01) |
| H01S 5/30 | (2006.01) |

(52) U.S. Cl.
CPC .......... *H01S 5/0202* (2013.01); *H01S 5/0206* (2013.01); *H01S 5/0422* (2013.01); *H01S 5/3013* (2013.01)

(58) Field of Classification Search
CPC .................................... H01L 23/12; H01S 5/02
USPC ........................ 438/46, 47; 257/88
See application file for complete search history.

(56) References Cited

U.S. PATENT DOCUMENTS

| | | |
|---|---|---|
| 5,763,290 A | 6/1998 | Nakajima |
| 2003/0143771 A1* | 7/2003 | Kidoguchi .......... H01L 21/0237 438/46 |
| 2005/0202596 A1 | 9/2005 | Fukuyo et al. |
| 2006/0228819 A1 | 10/2006 | Oshima |
| 2009/0148975 A1 | 6/2009 | Kohda |
| 2009/0203192 A1* | 8/2009 | Kaltalioglu ....... H01L 21/31116 438/462 |
| 2009/0227056 A1* | 9/2009 | Kyono ................... B82Y 20/00 438/33 |
| 2010/0226401 A1* | 9/2010 | Hasegawa .............. B82Y 20/00 372/45.01 |
| 2010/0267219 A1* | 10/2010 | Kajiyama .......... B23K 26/0057 438/462 |
| 2011/0062479 A1* | 3/2011 | Sugano ............... H01L 33/0095 257/98 |
| 2011/0158277 A1 | 6/2011 | Yoshizumi et al. |
| 2011/0275172 A1* | 11/2011 | Okabe ................. H01L 33/0095 438/33 |

(Continued)

FOREIGN PATENT DOCUMENTS

| | | |
|---|---|---|
| JP | H05-129725 A | 5/1993 |
| JP | H08-222798 A | 8/1996 |

(Continued)

*Primary Examiner* — Sheikh Maruf
(74) *Attorney, Agent, or Firm* — Foley & Lardner LLP (57) ABSTRACT

A method for producing a semiconductor laser element includes providing a semiconductor wafer comprising: a nitride semiconductor substrate, and a semiconductor stack located on the substrate, the semiconductor stack including a plurality of nitride semiconductor layers; forming in the substrate a fissure starting point and a fissure extending from the fissure starting point; forming a cleavage reference portion extending parallel to a cleavage plane of the semiconductor wafer as estimated from a plan view shape of the fissure; and cleaving the semiconductor wafer parallel to the cleavage reference portion to thereby obtain resonator end faces.

17 Claims, 9 Drawing Sheets

(56) References Cited

U.S. PATENT DOCUMENTS

| | | | |
|---|---|---|---|
| 2011/0298084 A1 | 12/2011 | Tamemoto | |
| 2011/0311276 A1* | 12/2011 | Yonehara | B41J 2/45 399/220 |
| 2012/0135554 A1* | 5/2012 | Yoshizumi | H01S 5/3202 438/33 |
| 2012/0258557 A1* | 10/2012 | Yoshizumi | B82Y 20/00 438/33 |
| 2013/0141833 A1* | 6/2013 | Moslehi | H01L 21/6833 361/234 |
| 2013/0313785 A1* | 11/2013 | Otschik | C23C 16/27 277/345 |
| 2014/0070249 A1* | 3/2014 | Yoon | H01L 33/62 257/98 |
| 2015/0221523 A1* | 8/2015 | Zundel | H01L 23/49838 257/734 |
| 2015/0311388 A1* | 10/2015 | Shimooka | H01L 33/007 257/615 |

FOREIGN PATENT DOCUMENTS

| | | |
|---|---|---|
| JP | 2006-290677 A | 10/2006 |
| JP | 2008-244121 A | 10/2008 |
| JP | 2009-073710 A | 4/2009 |
| JP | 2011-151349 A | 8/2011 |
| WO | WO-2003/076120 A1 | 9/2003 |
| WO | WO-2007/074688 A1 | 7/2007 |
| WO | WO-2010/098186 A1 | 9/2010 |

\* cited by examiner

METHOD FOR PRODUCING SEMICONDUCTOR LASER ELEMENT

CROSS-REFERENCE TO RELATED APPLICATION

The present application claims the benefit of Japanese Patent Application No. 2015-179967, filed on Sep. 11, 2015, the disclosure of which is hereby incorporated by reference in its entirety.

BACKGROUND

The present disclosure relates to methods for producing semiconductor laser elements.

As disclosed in Japanese Unexamined Patent Application Publication Nos. H08-222798 and 2006-290677, for example, a substrate having an orientation flat (OF) formed for a given crystal orientation identified by using X-ray diffraction, or the like, for producing a semiconductor laser element is known. Semiconductor laser elements are produced by forming semiconductor layers, electrodes, and so forth on such a substrate, and separating the elements into individual pieces by cleaving, or the like. Cleaving is performed by forming grooves on the wafer to assist cleaving, for example. However, the direction in which the wafer is to be split using the grooves, does not necessarily coincide with the cleavage plane of the substrate. Accordingly, PCT Application Publication No. WO 2007/074688, for example, proposes a method for correcting the splitting direction so that the wafer can be split roughly linearly even if it is not along the cleavage plane.

SUMMARY

However, correcting the splitting direction to a different direction from the cleavage plane would result in meandrous splitting, which can create a difference in level on the split faces. Producing a difference in level at the resonator end faces of the semiconductor laser element makes it difficult to achieve good laser properties.

An OF is the primary cause of the misalignment between the splitting direction using a groove and the cleavage plane. The wafer level process is normally performed using an OF, or an alignment mark formed using the OF, as a reference. In other words, electrodes and other members are formed and the splitting direction is decided under the assumption that the OF accurately indicates the direction of the cleavage plane, e.g., the OF face is in parallel to the cleavage plane. Accordingly, if the direction indicated by the OF is shifted, then the splitting direction would also be shifted. Such a shift can occur not only when the OF is formed, but also during the step of forming semiconductor layers following the formation of the OF. In the semiconductor layer forming step, the substrate is occasionally cleaned beforehand as a preparation, and this can round the corners of the OF. Moreover, semiconductor layers grow not only on the upper face, but also on the lateral face of the substrate. The semiconductor layer thickness on the lateral face rarely turns out to be uniform, thereby creating a situation where semiconductor layers of uneven thicknesses are attached to the OF lateral face. For this reason, it is difficult to use the OF which has existed before growing the semiconductor layers as a reference for cleaving.

In one embodiment, a method for producing a semiconductor laser element includes providing a semiconductor wafer having a nitride semiconductor substrate, and a semiconductor stack stacking a plurality of nitride semiconductor layers, including an active layer, on the substrate; forming a fissure starting point and a fissure occurring from the fissure starting point in the substrate; forming a cleaving reference portion extending in parallel to the cleavage plane of the semiconductor wafer estimated from the plan view shape of the fissure; and cleaving the semiconductor wafer in parallel to the cleaving reference portion to thereby obtain resonator end faces.

According to the method described above, a high precision cleaving reference portion can be formed after disposing a semiconductor stack, and thus cleaving can be facilitated in alignment with the semiconductor wafer's cleavage plane. This allows production of a semiconductor laser element having highly smooth resonator end faces.

DETAILED DESCRIPTION

One embodiment of the invention will be explained below with reference to drawings. The embodiment described below, however, is an exemplary method that embodies the technical ideas of the present invention, without the invention being limited thereto. In the explanation below, the same or similar members are shown for the same names or reference numerals, for which detailed explanation is omitted when appropriate.

Figure 4:
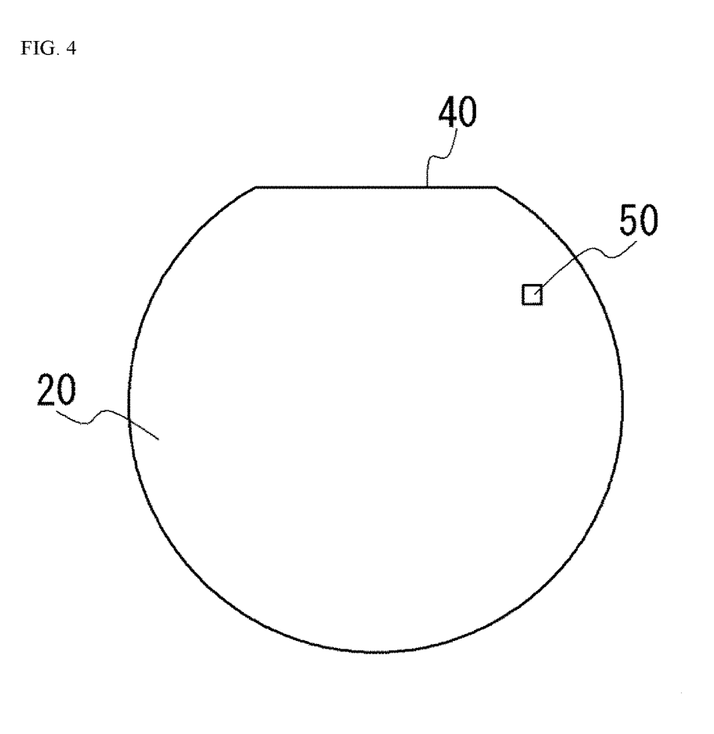
FIG. 4 is a schematic plan view explaining the method for producing the semiconductor laser according to the embodiment.
Figure 5A:
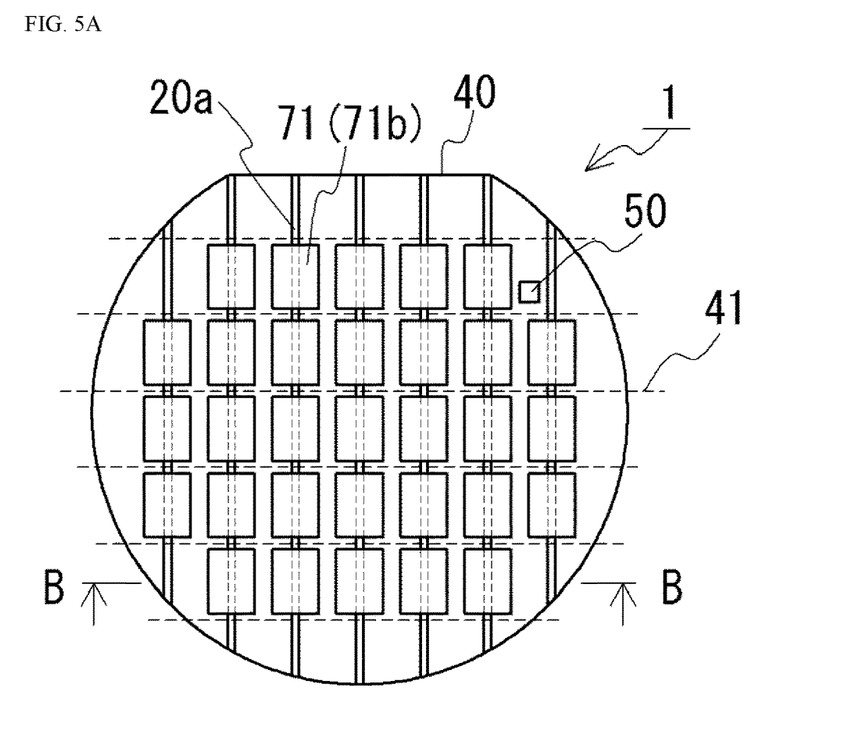
FIG. 5A is a schematic plan view explaining the method for producing the semiconductor laser according to the embodiment.
Figure 5B:
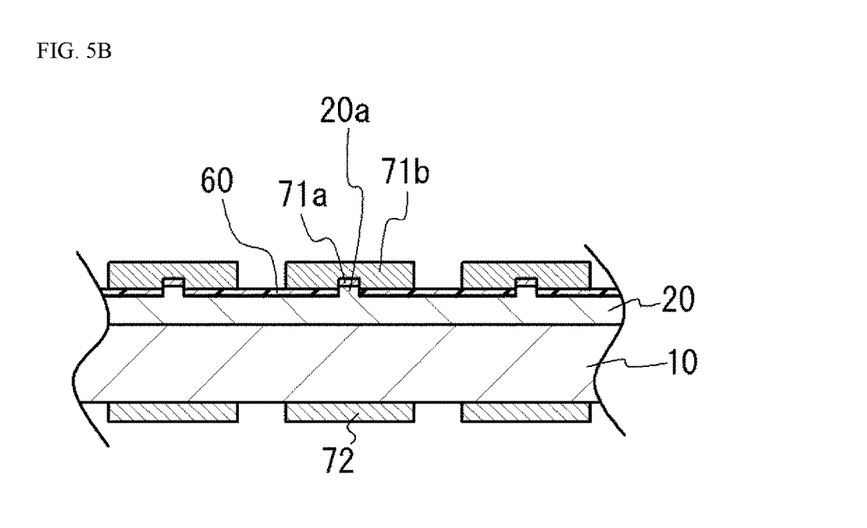
FIG. 5B is a sectional view along line B-B indicated in FIG. 5A
Figure 6:
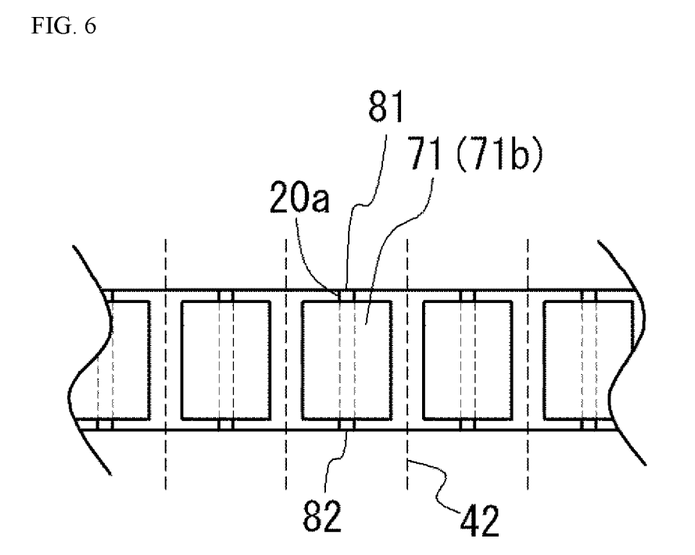
FIG. 6 is a schematic plan view explaining the method for producing the semiconductor laser according to the embodiment.
Figure 7A:
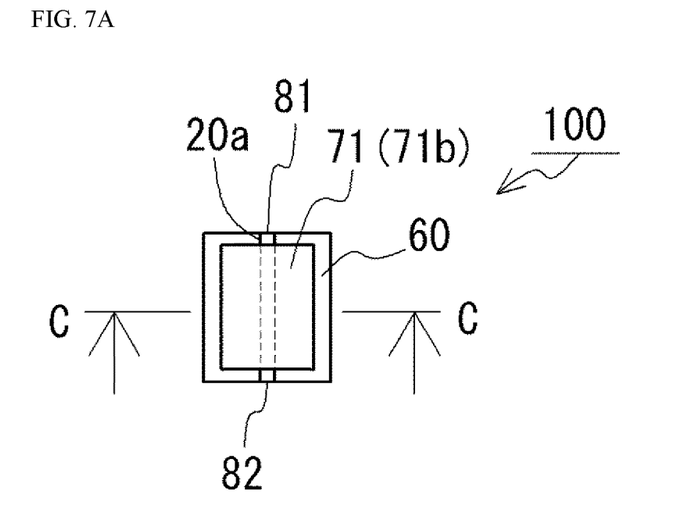
FIG. 7A is a schematic plan view explaining the method for producing the semiconductor laser according to the embodiment.
Figure 7B:
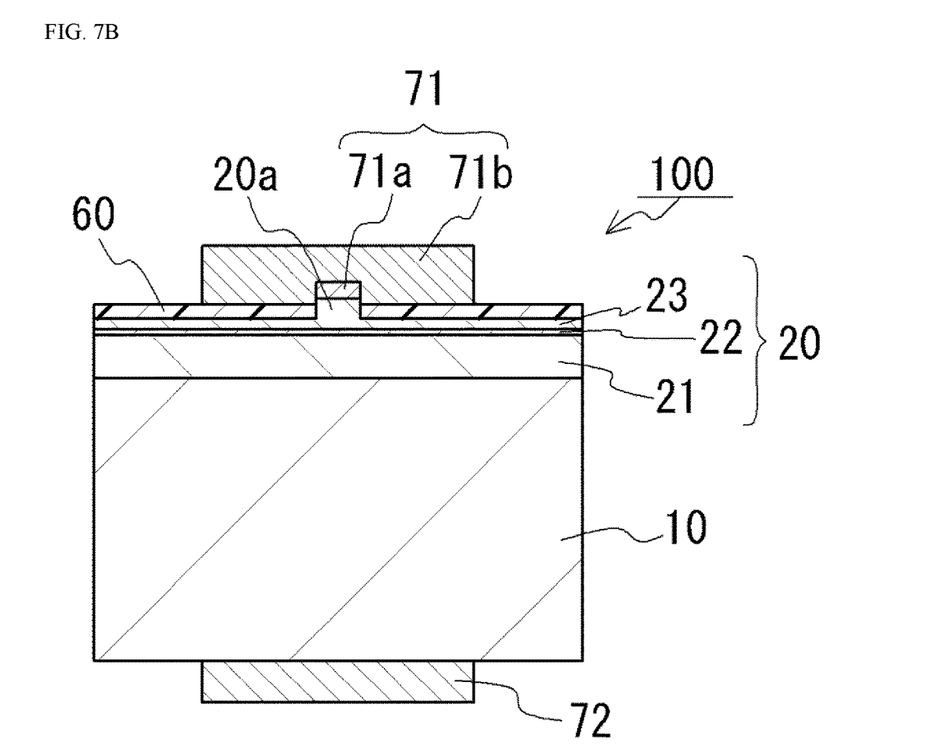
FIG. 7B is a sectional view along line C-C indicated in FIG. 7A.

FIG. 1A to FIG. 7B are schematic views explaining a method for producing a semiconductor laser element according to one embodiment. FIG. 1A, FIG. 2A, FIG. 3, FIG. 4, and FIG. 5A are top views of the semiconductor wafer 1, FIG. 6 is a top view of a bar shaped piece obtained by cleaving the semiconductor wafer 1, and FIG. 7A is a top view of the semiconductor laser element 100. FIG. 2B is a partial enlarged view of the semiconductor wafer 1. FIG. 1B is a sectional view along line A-A indicated in FIG. 1A. FIG. 5B is a sectional view along line B-B indicated in FIG. 5A, and FIG. 7B is a sectional view along line C-C indicated in FIG. 7A.

As shown in FIG. 1A to FIG. 7B, the method for producing the semiconductor laser element 100 according to this embodiment includes a step of providing a semiconductor wafer having a nitride semiconductor substrate, and a semiconductor stack stacking a plurality of nitride semiconductor layers, including an active layer, on the substrate, a step of forming a fissure starting point and a fissure occurring from the fissure starting point in the substrate, a step of forming a cleaving reference portion extending in parallel to the cleavage plane of the semiconductor wafer estimated from the plan view shape of the fissure, and a step of cleaving the semiconductor wafer in parallel to the cleaving reference portion to thereby obtain resonator end faces. The method will be explained in detail below.

Semiconductor Wafer Providing Step

Figure 1A:
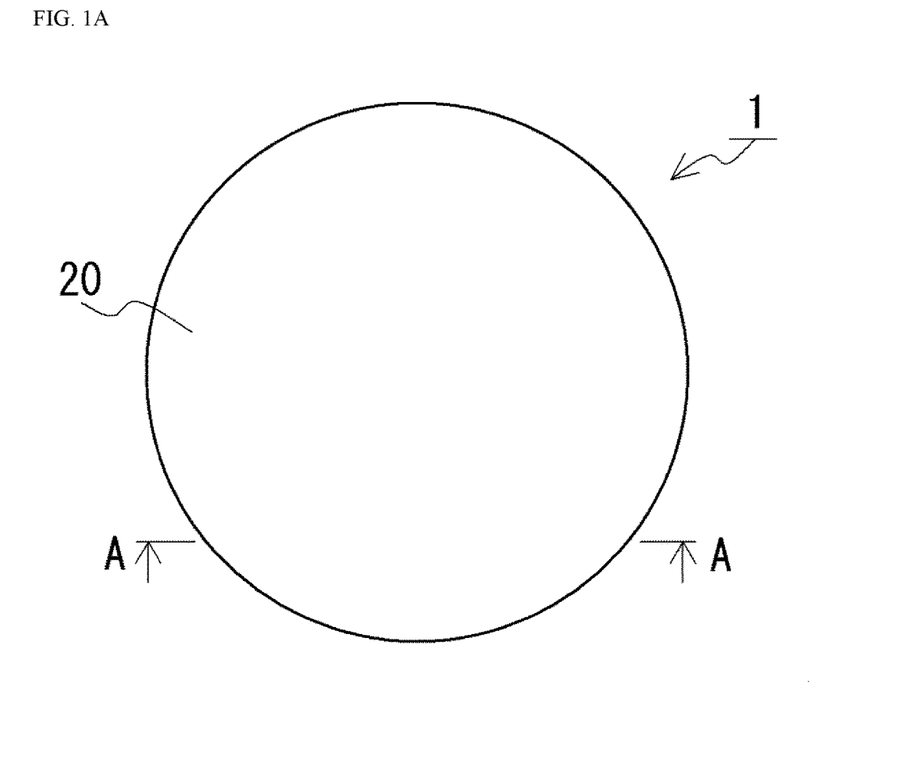
FIG. 1A is a schematic plan view explaining a method for producing a semiconductor laser element according to one embodiment of the invention.
Figure 1B:
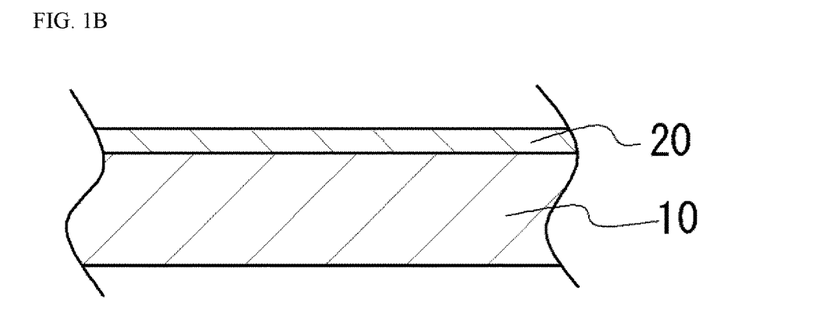
FIG. 1B is a sectional view along line A-A indicated in FIG. 1A.

First, the semiconductor wafer 1 is provided as shown in FIG. 1A and FIG. 1B. The semiconductor wafer 1 has a substrate 10 and a semiconductor stack 20 formed thereon. Given that both the substrate 10 and the semiconductor stack 20 are made of a nitride semiconductor, the cleavage plane of the semiconductor stack 20 and the cleavage plane of the substrate 10 are substantially in alignment.

Figure 8:
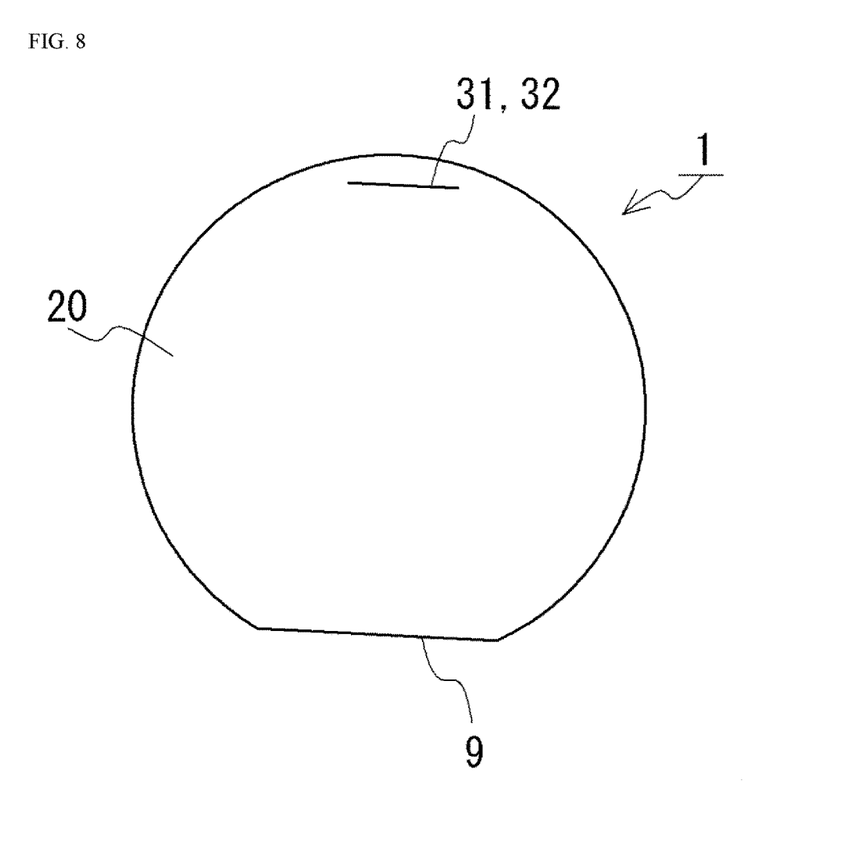
FIG. 8 is a schematic plan view explaining a variation of the method for producing the semiconductor laser element.

For the substrate 10, a GaN substrate, for example, is provided. The cleavage plane of GaN having the wurtzite crystal structure is the m-plane, i.e., the {10-10} plane. The substrate 10 of this embodiment has the upper plane that is the c-plane, for example the (0001) plane, and the m-plane, which is the cleavage plane, is perpendicular to the upper face. The upper face of the substrate 10 can have an off-cut angle. The off-cut angle, for example, is in a range between 0.03 and 1 degrees. The substrate 10, for example, is circular in shape of 2 inches in diameter in a plan view. The semiconductor stack 20 may alternatively be formed on the substrate 10 having an orientation flat (OF) as shown in FIG. 8.

The semiconductor stack 20, similar to the substrate 10, has the c-plane as the upper face, which is on the opposite side of the substrate 10, and the m-plane, which is the cleavage plane, is perpendicular to the upper face. The semiconductor 20 is preferably made of a group III nitride semiconductor. Group III semiconductors include GaN, InGaN, AlGaN, and the like. The semiconductor stack 20 has at least an active layer 22, and for example, has from the substrate 10 side, an n-side nitride semiconductor layer 21, an active layer 22, a p-side nitride semiconductor layer 23 as shown in FIG. 7B. The n-side nitride semiconductor layer 21 includes an n-type nitride semiconductor layer, and may include an undoped layer. The p-side nitride semiconductor layer 23 includes a p-type nitride semiconductor layer, and may include an undoped layer. The active layer 22, made of a nitride semiconductor, can have a single quantum well structure or a multiple quantum well structure. The semiconductor stack 20, for example, has an n-side clad layer, an n-side optical guide layer, an active layer 22, a p-side electron-confinement layer, a p-side optical guide layer, a p-side clad layer, and a p-side contact layer in that order from the substrate 10 side.

Fissure Starting Point and Fissure Forming Step

Figure 2A:
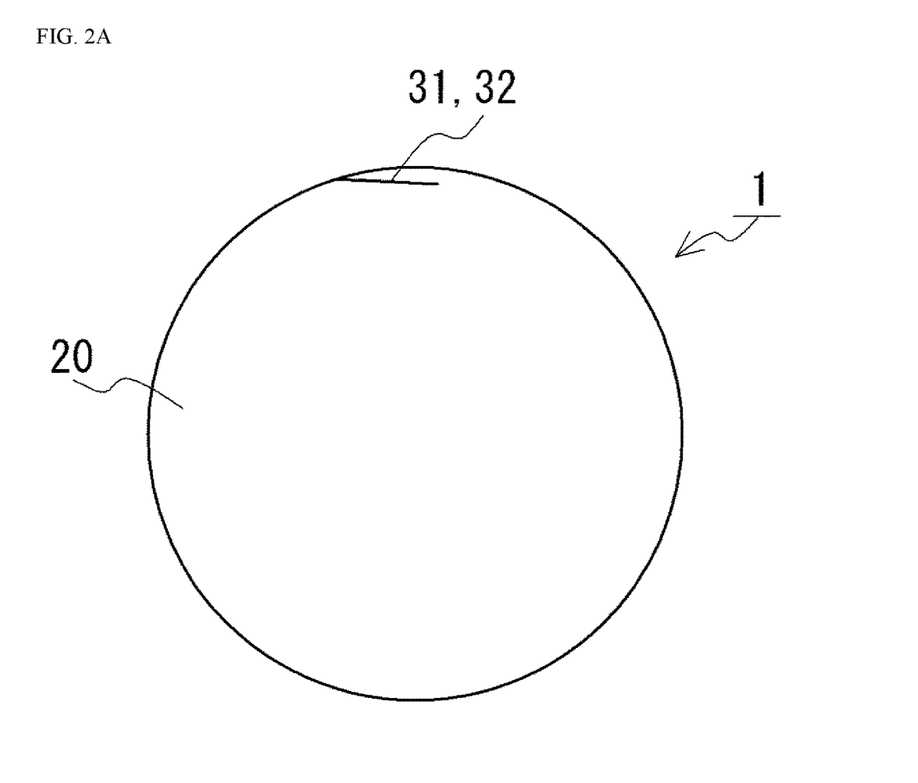
FIG. 2A is a schematic plan view explaining the method for producing the semiconductor laser element according to the embodiment.

Next, as shown in FIG. 2A, a fissure starting point 31 and a fissure 32 occurring from the fissure starting point 31 are formed. Because the semiconductor wafer 1 has a cleavage property, the fissure 32 tends to run in parallel to the cleavage plane of the semiconductor wafer 1. This can be utilized to identify the direction which is in parallel to the cleavage plane of the semiconductor wafer 1. The cleavage plane, the cleavage property, of the semiconductor wafer 1 herein refers to the cleavage plane, the cleavage property, of both the substrate 10 and the semiconductor stack 20.

The fissure starting point 31 and the fissure 32 are preferably formed in the area near the outer edge of the semiconductor wafer 1. The portion where the fissure starting point 31 and the fissure 32 are formed is not suitable for forming semiconductor laser elements 100. For this reason, it is preferable to form the fissure starting point 31 and the fissure 32 in the area near the outer edge of the semiconductor wafer 1 normally not used for forming semiconductor laser elements 100. This can limit the reduction in the area where the semiconductor laser elements 100 can be formed. On the other hand, the area near the periphery of the substrate 10 may not have sufficient crystallinity compared to the inner area, and this can make it difficult to estimate the cleavage plane from the fissure 32. For this reason, it is preferable to form the fissure starting point 31 and the fissure 32 in the area near the outer edge of the semiconductor wafer 1, but in the area having good enough crystallinity to form a semiconductor laser element 100. The fissure 32 may reach the outer edge, but if the crystallinity is insufficient at the outer edge, it is considered more efficient to form the fissure 32 in a location where it does not reach the outer edge as shown in FIG. 8, because the fissure 32 occurring at the outer edge cannot be used to estimate the cleavage plane.

Figure 2B:
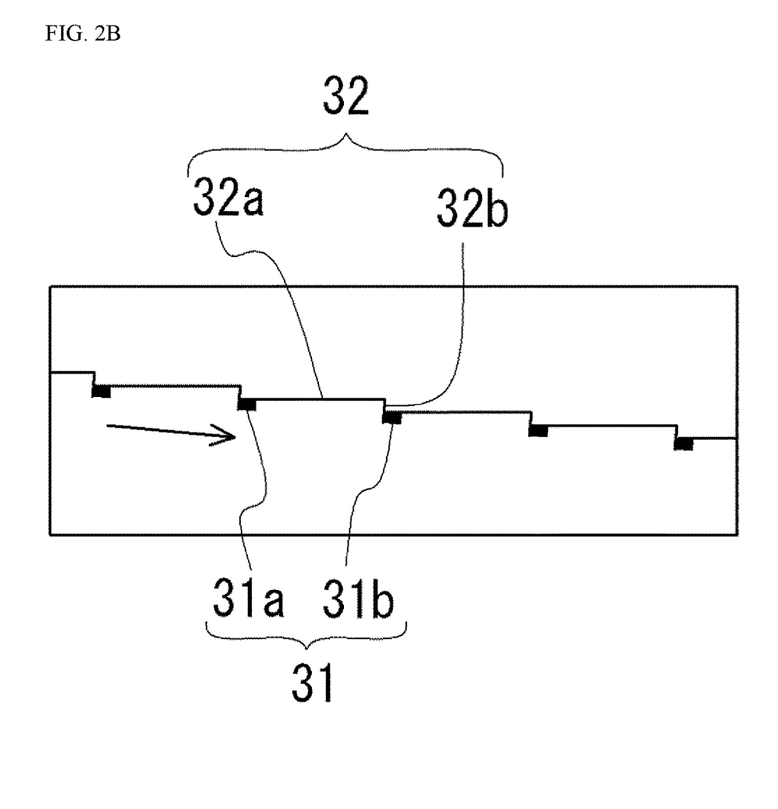
FIG. 2B is a partial enlarged view of FIG. 2A.

FIG. 2B shows an example. In FIG. 2B, a plurality of fissure starting points 31 forming a line are created, and the fissures 32 are generated so as to link the fissure starting points 31. The fissures 32 propagates in the direction indicated by the arrow in FIG. 2B. The fissure 32 linearly extends from the initial point side fissure starting point 31a along the cleavage plane, which is the first portion 32a, and is drawn to and terminated at the terminal point side fissure starting point 31b, which is the second portion 32b. This can be repeated at each distance between the fissure starting points 31. In this case, the direction in which the first portions 32a extend can be estimated to be in parallel to the cleavage plane of the semiconductor wafer 1.

The fissure starting points 31 and the fissures 32 can be formed by various methods. For example, by focusing a pulsed laser beam inside the semiconductor wafer 1, a plurality of laser-processed portions, i.e., the fissure starting points 31, and the fissures 32 connecting the laser-processed portions, can be formed. The pulsed laser beam used in this process has a wavelength that passes through the semiconductor wafer 1, and a pulse width setting that can form the laser-processed portions, which are the fissure starting points 31, inside the semiconductor wafer 1 by multiphoton absorption or the like. Forming a plurality of laser-processed portions by using such a pulsed laser beam is beneficial in allowing the fissures 32 to be generated without requiring any external force. Application of an external force can completely split the semiconductor wafer 1, and if completely split, the effective area of the semiconductor wafer 1 would be reduced. This can be avoided when no external force is required, and thus a reduction in the effective area of the semiconductor wafer 1, i.e., the area of the wafer in which semiconductor laser elements can be formed, can be limited. This method can also form the fissures 32 at locations not reaching the outer edge of the semiconductor wafer 1.

It is preferable if the fissures 32 can be observed from the surface of the semiconductor wafer 1. Specifically, it is preferable to set the laser processing intervals to be short enough for the fissures 32 to occur naturally, and set the depth of the focus position of the pulsed laser beam so that the fissures 32 can naturally reach the surface of the semiconductor wafer 1. The fissures 32 in this case only need to reach one of the surfaces, not both, of the semiconductor wafer 1. The surface reached by the fissures 32 is preferably the upper face of the semiconductor stack 20. It is easier to observe the plan view shapes of the fissures 32 from the side reached by the fissures 32. Thus, it is preferable to form the cleavage reference portion 40 from the same side the fissures 32 are observed from the perspective of increasing the alignment accuracy with the cleavage plane. A ridge can be formed with high precision by checking and aligning with the cleavage reference portion 40 from the side on which the cleavage reference portion 40 is formed. In other words, the ridge can be more easily formed with high precision on the face reached by the fissures 32 than the opposite face. Accordingly, it is preferable to make the upper face of the semiconductor stack 20, which requires processing for structuring semiconductor laser elements, the surface that the fissures 32 would reach. This can not only allow the cleaving step described later to be performed in the direction substantially in alignment with the actual cleavage plane, but also achieve the positional relationship between the cleaved faces obtained by the cleaving step and the ridge at a high degree of certainty. The plurality of laser-processed portions, for example, are formed to form a line at about the same depth inside the semiconductor wafer 1.

The fissure 32 preferably reaches the laser-processed portion on the terminal point side by propagating from the laser-processed portion on the initial point side of the pulsed laser beam, in a first direction different from the direction of the shortest distance to the terminal point of the pulsed laser beam, and subsequently turning to a second direction different from the first direction in a plan view. The straight line portion propagates in the first direction from the initial point side laser-processed portion, and the first direction can be estimated to be the direction that is in parallel to the cleavage plane of the semiconductor wafer 1.

Another method for producing the fissure starting points 31 and the fissures 32 involves forming an indentation as a fissure starting point 31 on the semiconductor wafer 1, and forming a fissure 32 by cleaving the semiconductor wafer 1 using the indentation as the starting point. The cleaving is performed by applying an external force. The semiconductor wafer 1 may be completely split by cleaving, and the shape of the fissure 32 in this case is split face shaped. The indentation may be formed on the lower face of the substrate 10, but is preferably formed on the upper face of the semiconductor stack 20. Because the portion near the starting point of cleavage tends to be the face having high accuracy of alignment with the cleavage plane of the semiconductor wafer 1, it is preferable to observe the shape of the fissure 32 from the side on which the indentation, i.e., the starting point of cleavage, is formed. This is because, similar to the case using the pulsed laser beam described above, a ridge can be more easily formed with high precision on the indentation formed face than the opposite face. The indentation can be formed by etching, irradiating a laser beam on the surface of the semiconductor wafer 1, or by combining these techniques. The method for cleaving a semiconductor wafer using an indented starting point is known as a splitting method for producing resonator end faces. The fissures 32 may be formed by using a similar method to that for producing resonator end faces.

The indentation can be single or plural. If it is a single indentation, it is preferably a groove shaped indentation extending in one direction. It is preferable to produce a plurality of indentations along a direction, and this can control the direction in which the wafer is split by cleaving. When a plurality of indentations are formed, it is preferable for the fissures 32 to reach the indentation on the terminal point side by advancing along a first direction different from the line connecting the shortest distance to the indentation on the terminal point side from the indentation on the initial point side, and turning to a second direction different from the first direction in a plan view. This allows for the first direction to be estimated as the direction that is in parallel to the cleavage plane of the semiconductor wafer 1.

If there is not, or it is difficult to identify, a linearly extending portion from the initial point side fissure starting point 31a, such as the first portion 32a in FIG. 2B, it suffices to create another fissure starting point 31 and a fissure 32 so that the fissure 32 extends in a different direction. The second and subsequent fissures 32 are preferably formed in the locations spaced apart from the fissure 32 which had already been formed so that their shapes can be easily observed. It is preferable to also form the fissure starting points 31 in such a manner. The extending direction of the fissures 32 can be changed by altering the size, spacing, orientation, and the like of the fissure starting points 31. The smaller the misalignment between the direction along which a plurality of fissure starting points 31 are arranged and the cleavage plane of the semiconductor wafer 1, the easier it is considered to obtain a linearly extending portion, such as the first portion 32a. For this reason, it is preferable to form the fissure starting points 31 by avoiding the direction that produces the most misalignment with the cleavage plane. The direction producing the most misalignment is in parallel to a-plane, i.e., {11-20} plane, of the semiconductor wafer 1. It is thus preferable to form the fissure starting points 31 along the direction that meets a-plane of the semiconductor wafer 1.

If the substrate 10 has an OF 9, as shown in FIG. 8, the fissure starting points 31 can be formed using the OF 9 as a guide. For example, if the OF 9 is formed substantially in parallel to the cleavage plane of the substrate 10, the fissure starting points 31 can be arranged along the direction substantially in parallel to the OF 9. This can reduce misalignment between the direction in which fissures 32 run and the cleavage plane of the semiconductor wafer 1, thereby reducing the number of attempts for forming the fissure starting points 31 and the fissures 32. In this case, moreover, the area where the fissures 32 are formed is preferably in the vicinity of the outer edge other than the OF 9, i.e., in the vicinity of an arc-shaped portion of the semiconductor wafer 1. Forming the fissures 32 in the vicinity of the outer edge other than the OF 9 can reduce the area of the region in which the semiconductor laser elements are not formed compared to the case where the fissures 32 are formed in the vicinity of the OF 9. For example, as shown in FIG. 8, the fissure starting points 31 and the fissures 32 are formed in the area opposite the OF 9 of the semiconductor wafer 1.

Cleavage Reference Portion Forming Step

Figure 3:
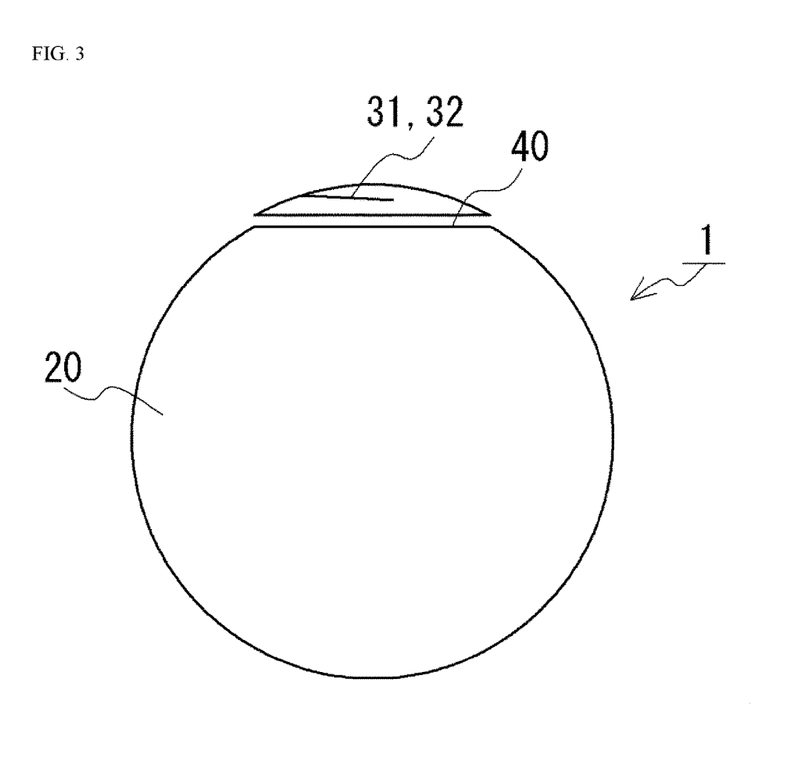
FIG. 3 is a schematic plan view explaining the method for producing the semiconductor laser according to the embodiment.

Next, as shown in FIG. 3, a cleavage reference portion 40 extending in parallel to the cleavage plane of the semiconductor wafer 1 estimated from the plan view shape of the fissures 32 is formed. The method for estimating the direction in parallel to the cleavage plane is as described above. The cleavage reference portion 40, for example, is formed to a shape that extends in parallel to the first direction described above.

The cleavage reference portion 40 is a mark that can be used as a reference for obtaining the resonator end faces discussed later. Specific examples include splitting of the semiconductor wafer 1 in the direction in parallel to the estimated cleavage plane, or forming of grooves extending in parallel to the estimated cleavage plane of the semiconductor wafer 1. Forming the cleavage reference portion 40, i.e., the cleavage reference face, by splitting the semiconductor wafer 1 has the benefit of allowing the cleavage reference portion 40 to be handled like an OF. For example, a mask can be aligned using the cleavage reference portion 40 as a reference, as in the case of aligning a mask using an OF as a reference. The cleavage reference portion 40 preferably has a large enough size to allow for the accurate reading of the direction indicated by the cleavage reference portion 40. The length of at least 1 mm would prevent the direction indicated by the cleavage reference portion 40 from being misidentified. If the cleavage reference portion 40 is used in a similar manner to the OF, the size preferably is also about the same as that of the OF. For example, the length of the cleavage reference portion 40 is preferably at least 10 mm for a semiconductor wafer 1 having a diameter of two inches. In order to fully secure the effective area of the semiconductor wafer 1, moreover, the length of the cleavage reference portion 40 is preferably one half of the diameter of the semiconductor wafer 1 at most.

Furthermore, as shown in FIG. 3, the cleavage reference portion 40 is preferably formed by splitting the semiconductor wafer 1 so as to separate the area in which the fissure starting points 31 and fissures 32 were formed. As described earlier, the area in which the fissure starting points 31 and fissures 32 are formed is not suitable for forming semiconductor laser elements 100. Accordingly, in the case of forming a cleavage reference portion 40 by splitting, such an area is preferably included in the section of the wafer to be separated. In the case of forming a cleavage reference portion 40 by splitting, a method similar to that which uses an indentation as the starting point of cleavage described above can also be used, but the method for forming laser-processed portions inside a semiconductor wafer 1 is considered to be able to split the wafer more accurately in the intended direction.

Alignment Mark Forming Step

As shown in FIG. 4, the step of forming an alignment mark 50 on the semiconductor wafer 1 can be performed using the cleavage reference portion 40 as a reference after the step of forming a cleavage reference portion 40, but before the step of obtaining resonator end faces 81 and 82 discussed later. The alignment mark 50 can be used for aligning a mask or the like in the subsequent steps. The alignment mark 50 can be formed, for example, by etching off a portion of the semiconductor stack 20. In the example shown in FIG. 4, the alignment mark 50 is shown as a square, but can be of any given shape.

P Electrode Forming Step and N Electrode Forming Step

As shown in FIG. 5A and FIG. 5B, the step of forming a p electrode 71 on the semiconductor wafer 1 and the step of forming an n electrode 72 on the semiconductor wafer 1 can be performed after the step of forming a cleavage reference portion 40, but before the step of obtaining resonator end faces 81 and 82 discussed later.

The p electrode 71 is formed, for example, on the semiconductor stack 20 side of the semiconductor wafer 1, and the n electrode 72 is formed, for example, on the substrate 10 side of the semiconductor wafer 1. Since the p electrode 71 in this case will be formed on the same side as that of the alignment mark mentioned earlier, it is preferable to position the p electrode 71 by using the alignment mark as a reference. In other words, in the step of forming a p electrode 71, the p electrode 71 is preferably formed on the semiconductor stack 20 side of the semiconductor wafer 1 using the alignment mark 50 as a positioning reference. Similar to the p electrode 71, the n electrode 72 which is formed on the opposite side of the alignment mark 50 may also be positioned using the alignment mark 50 as a reference. In this case, the alignment mark 50 can be checked, for example, through the substrate 10 and the semiconductor stack 20 from the side the n electrode 72 will be formed. The benefit of positioning them using the alignment mark 50 as a reference is as follows. In the case of forming the cleavage reference portion 40 (cleavage reference face) by splitting, the cleavage reference portion 40 can be eroded by etching or the like. This can shift the direction indicated by the cleavage reference portion 40 from the direction that should be indicated. Such a concern is absent when using the alignment mark 50 which is an indentation formed on the surface of the semiconductor wafer 1, making it suitable for use as an alignment reference.

Various steps necessary for the semiconductor laser element 100 can be performed between the step of forming the cleavage reference portion 40 and the step of obtaining the resonator end faces 81 and 82. These steps include a step of forming a ridge 20a, a step of forming an insulation film 60, and the like. For these steps also, a mask or the like is preferably aligned by using the cleavage reference portion 40 or the alignment mark 50 as a reference. For example, by forming the p electrode 71 using a reference substantially coinciding with the cleavage plane of the semiconductor wafer 1, the splitting positions shown by the pattern of the p electrode 71 can substantially be matched to the cleavage plane of the semiconductor wafer 1. The order of formation is, for example, the ridge 20a, the insulation film 60, the p electrode 71, and the n electrode 72. Before forming the n electrode 72, a step of thinning the thickness of the substrate 10 may be performed.

The ridges 20a, which are linearly extending protrusions, are formed by removing portions of the semiconductor stack 20. The insulation film 60 is formed by opening at least a portion of the upper face of ridge 20a. The current constriction caused by the insulation film 60 makes the areas where the ridge 20a is formed optical waveguide. For this reason, when formed, the ridge 20a is stripe-shaped extending in one direction in a plan or top view. For the p electrode 71, a first layer 71a can be formed so as to come into contact with the surface of the ridge 20a exposed from the insulation film 60, for example, and a second layer 71b can be formed thereon. The n electrode 72 can be formed at the bottom face of the substrate 10. The substrate 1 can be made of an n-type nitride semiconductor.

Resonator End Face Forming Step

Next, as shown in FIG. 6, the semiconductor wafer 1 is cleaved in the direction in parallel to the cleavage reference portion 40 to obtain resonator end faces 81 and 82. Cleaving is performed along the broken lines indicated in FIG. 5A to obtain a bar-shaped piece shown in FIG. 6. The semiconductor wafer 1 may alternatively be cleaved after being divided into several pieces. As for the cleaving method, one similar to the method described above using an indentation as the starting point, for example, can be used. Cleaving the semiconductor wafer 1 in the direction in parallel to the cleavage reference portion 40 includes utilization of the alignment mark 50 discussed above. In other words, an alignment mark 50 is formed using the cleavage reference portion 40 as a reference, a p electrode 71 and other members are formed using the alignment mark 50 as a reference, and the semiconductor wafer 1 can be cleaved in the direction in parallel to the cleavage reference portion 40 by cleaving at the cleaving positions 41 indicted by the members. The cleaving positions 41 indicated by the members, for example, are imaginary lines running through the spaces between the second layers 71b of the p electrode shown in FIG. 5A, which extend perpendicular to the direction in which the ridge 20a extends. Moreover, the resonator end faces are the light emitting face 81 and the light reflecting face 82 located on the opposite side. Reflective film of a different reflectance may be formed on the light emitting face 81 and the light reflecting face 82 so that the light emitting face 81 has a lower reflectance than the light reflecting face 82.

Separation Step

The bar-shaped piece shown in FIG. 6 obtained by cleaving is divided at the dividing positions 42 into an individual piece of semiconductor laser element 100 shown in FIG. 7A and FIG. 7B. The dividing position 42 is an imaginary line extending substantially perpendicularly to the resonator end faces 81 and 82. Such separation is performed, for example, by forming grooves on the surface of the bar-shaped piece by laser scribing or cutter scribing, followed by breaking. The order of the separation step and the cleaving step described above can be reversed. That is, cleaving can be performed after separating the wafer in parallel to the direction in which the ridge 20a extends. In the case where reflecting films are formed, it is preferable to perform the steps in the order described for this embodiment, the cleaving step followed by the separation step, because it is preferable to form the films when the wafer is in the bar-shaped condition.

According to the embodiment explained above, the cleavage reference portion 40 can be highly accurately formed after disposing the semiconductor stack 20, thereby facilitating cleaving in the direction consistent with the cleavage plane of the semiconductor wafer 1. This can produce semiconductor laser elements 100 having highly smooth resonator end faces 81 and 82.

What is claimed is:

1. A method for producing a semiconductor laser element, the method comprising:
    providing a semiconductor wafer comprising:
        a nitride semiconductor substrate, and
        a semiconductor stack located on the substrate, the semiconductor stack including a plurality of nitride semiconductor layers;
    forming in the substrate a fissure starting point and a fissure extending from the fissure starting point;
    estimating a cleavage plane of the semiconductor wafer based on a plan view shape of the fissure;
    forming a cleavage reference portion extending parallel to a cleavage plane of the semiconductor wafer as estimated based on the plan view shape of the fissure; and
    cleaving the semiconductor wafer parallel to the cleavage reference portion to thereby obtain resonator end faces.

2. The method for producing a semiconductor laser element according to claim 1, wherein the cleavage reference portion is formed by splitting the semiconductor wafer.

3. The method for producing a semiconductor laser element according to claim 1, wherein the fissure starting point and the fissure are formed in the area in a vicinity of an outer edge of the semiconductor wafer.

4. The method for producing a semiconductor laser element according to claim 3, wherein the cleavage reference portion is formed by splitting the semiconductor wafer so as to separate an area in which the fissure starting point and the fissure have been formed from a remainder of the semiconductor wafer.

5. The method for producing a semiconductor laser element according to claim 1,
    wherein a plurality of fissure starting points are formed in the substrate, including a first fissure starting point and a second fissure starting point,
    wherein the fissure connects two of the fissure starting points, and
    wherein the fissure starting points and the fissure are formed by focusing a pulsed laser beam, the fissure starting points being laser processed portions that are processed by the pulsed laser beam.

6. The method for producing a semiconductor laser element according to claim 5, wherein, in a plan view, the fissure propagates from the fissure starting point on an initial point side of the pulsed laser beam in a first direction that is different from a direction of a shortest distance to the second laser-processed portion on a terminal point side of the pulsed laser beam, and subsequently turns in a second direction that is different from the first direction to reach the second laser-processed portion.

7. The method for producing a semiconductor laser element according to claim 6, wherein, in the step of forming the cleavage reference portion, the cleavage reference portion is formed so as to extend parallel to the first direction.

8. The method for producing a semiconductor laser element according to claim 1, further comprising, after forming the cleavage reference portion, but before cleaving the semiconductor wafer, forming a p electrode on the semiconductor wafer and forming an n electrode on the semiconductor wafer.

9. The method for producing a semiconductor laser element according to claim 8, further comprising, after forming the cleavage reference portion, but before cleaving the semiconductor wafer, forming an alignment mark on the semiconductor wafer on the semiconductor stack side by using the cleavage reference portion as a reference, wherein the p electrode is formed on a semiconductor stack side of the semiconductor wafer by using the alignment mark as a positioning reference.

10. The method for producing a semiconductor laser element according to claim 1, wherein the nitride semiconductor substrate is a GaN substrate, and the semiconductor stack is made of a group III nitride semiconductor grown on the GaN substrate.

11. A method for producing a semiconductor laser element comprising:
    providing a semiconductor wafer comprising:
        a nitride semiconductor substrate, and
        a semiconductor stack located on the substrate, the semiconductor stack including a plurality of nitride semiconductor layers;
    forming in the semiconductor wafer a fissure starting point and a fissure extending from the fissure starting point;
    estimating a cleavage plane of the semiconductor wafer based on a plan view shape of the fissure;
    forming a cleavage reference portion extending parallel to a cleavage plane of the semiconductor wafer as estimated based on the plan view shape of the fissure;
    forming an alignment mark on a semiconductor stack side of the semiconductor wafer by using the cleavage reference portion as a reference;

forming a p electrode on the semiconductor stack side of the semiconductor wafer by using the alignment mark as a positioning reference; and cleaving the semiconductor wafer by using the p electrode as a positioning reference to thereby obtain resonator end faces.

12. The method for producing a semiconductor laser element according to claim 11, wherein the fissure extends to the semiconductor stack side of the semiconductor wafer.

13. A method for producing a semiconductor laser element comprising:

providing a semiconductor wafer comprising:
- a GaN substrate, and
- a semiconductor stack located on the substrate, the semiconductor stack including a plurality of group III nitride semiconductor layers;

forming in the semiconductor wafer a fissure starting point and a fissure extending from the fissure starting point;

estimating a cleavage plane of the semiconductor wafer based on a plan view shape of the fissure;

forming a cleavage reference portion extending parallel to a cleavage plane of the semiconductor wafer as estimated based on the plan view shape of the fissure;

forming a p electrode and an n electrode on the semiconductor wafer; and cleaving the semiconductor wafer parallel to the cleavage reference portion to thereby obtain resonator end faces.

14. The method for producing a semiconductor laser element according to claim 13 further comprising, after forming the cleavage reference portion, but before forming the p electrode, forming an alignment mark on a semiconductor stack side of the semiconductor wafer by using the cleavage reference portion as a reference, wherein the p electrode is formed on the semiconductor stack side of the semiconductor wafer by using the alignment mark as a positioning reference.

15. The method for producing a semiconductor laser element according to claim 1, wherein the fissure includes a plurality of first straight line portions, each extending from a starting point to a terminal point, and a plurality of second portions, each extending from a terminal point of one of the first portions to a starting point of an adjacent one of the first portions, and wherein the step of estimating the cleavage plane of the semiconductor wafer based on the plan view shape of the fissure comprises estimating the cleavage plane to be parallel to the direction in which the first straight line portions extend.

16. The method for producing a semiconductor laser element according to claim 11, wherein the fissure includes a plurality of first straight line portions, each extending from a starting point to a terminal point, and a plurality of second portions, each extending from a terminal point of one of the first portions to a starting point of an adjacent one of the first portions, and wherein the step of estimating the cleavage plane of the semiconductor wafer based on the plan view shape of the fissure comprises estimating the cleavage plane to be parallel to the direction in which the first straight line portions extend.

17. The method for producing a semiconductor laser element according to claim 13, wherein the fissure includes a plurality of first straight line portions, each extending from a starting point to a terminal point, and a plurality of second portions, each extending from a terminal point of one of the first portions to a starting point of an adjacent one of the first portions, and wherein the step of estimating the cleavage plane of the semiconductor wafer based on the plan view shape of the fissure comprises estimating the cleavage plane to be parallel to the direction in which the first straight line portions extend.

* * * * *